United States Patent
Passeraub

(10) Patent No.: US 6,194,961 B1
(45) Date of Patent: Feb. 27, 2001

(54) MICROSTRUCTURE INCLUDING A CIRCUIT INTEGRATED IN A SUBSTRATE ON ONE SURFACE OF WHICH IS ARRANGED A FLAT COIL

(75) Inventor: Philippe Passeraub, Oberriet (CH)

(73) Assignee: Asulab S.A., Bienne (CH)

( * ) Notice: Subject to any disclaimer, the term of this patent is extended or adjusted under 35 U.S.C. 154(b) by 0 days.

(21) Appl. No.: 09/342,226

(22) Filed: Jun. 29, 1999

(30) Foreign Application Priority Data

Jun. 30, 1998 (EP) ................................................ 98112052

(51) Int. Cl.[7] ................................................ H01L 25/00
(52) U.S. Cl. .......................... 327/566; 327/565; 327/110; 257/531
(58) Field of Search .................................. 327/110, 112, 327/564, 565, 566; 257/531

(56) References Cited

U.S. PATENT DOCUMENTS

| | | | |
|---|---|---|---|
| 4,157,563 | * 6/1979 | Bosselaar | 257/531 |
| 5,095,357 | * 3/1992 | Andoh et al. | 257/531 |
| 5,194,402 | * 3/1993 | Ehrfeld et al. | 437/180 |
| 5,416,356 | * 5/1995 | Staudinger et al. | 257/531 |
| 5,483,207 | * 1/1996 | Gabara | 257/531 |
| 5,539,241 | * 7/1996 | Abidi et al. | 257/531 |
| 5,726,598 | * 3/1998 | Terashima et al. | 327/565 |
| 5,880,506 | * 3/1999 | Maier et al. | 327/564 |
| 5,952,893 | * 3/1999 | Ghoshal | 251/531 |
| 5,959,473 | * 9/1999 | Sakuragi | 327/112 |

FOREIGN PATENT DOCUMENTS

| | | |
|---|---|---|
| 60-182175 | 9/1985 | (JP) . |
| 8-88324 | 8/1996 | (JP) . |

* cited by examiner

Primary Examiner—Terry D. Cunningham
(74) Attorney, Agent, or Firm—Sughrue, Mion, Zinn, Macpeak & Seas, PLLC

(57) ABSTRACT

The microstructure includes an electronic circuit formed by a plurality of transistors (6) and a flat coil formed by a conductive wire or a conductive path (14). The coil (10) is arranged on an upper face (8) of the semiconductor substrate (4). The coil (10) generates a magnetic field (B) in this substrate (4) in the vicinity of the transistors (6) which are situated in superposition with said coil (10). The source (20) and the collector (22) of the sensitive transistors (6) are aligned along a direction perpendicular to the wire or path (14) in the portion of the coil situated in proximity to each of said transistors (6). Thus, the electric current (I) flowing in the transistors (6) is substantially parallel to the magnetic field (B).

5 Claims, 2 Drawing Sheets

MICROSTRUCTURE INCLUDING A CIRCUIT INTEGRATED IN A SUBSTRATE ON ONE SURFACE OF WHICH IS ARRANGED A FLAT COIL

BACKGROUND OF THE INVENTION

The present invention concerns a microstructure including a circuit integrated in a substrate on one upper or lower surface of which is arranged a flat coil, in particular a spiral coil galvanically deposited on a passivation layer provided on the surface of the substrate. More particularly, the invention concerns a microstructure including an electronic circuit formed by a plurality of transistors integrated in a semiconductor substrate and a flat coil arranged at the surface of the semiconductor substrate.

Within the scope of the present invention, in order to reduce to the maximum the dimensions of the developed microstructure, said flat coil is superposed at least partially with said aforementioned electronic circuit. However, within the scope of the development of this microstructure of reduced dimensions, the inventor has observed that the magnetic field generated by the flat coil-has an influence on certain sensitive transistors of the integrated electronic circuit under the surface defined by the flat coil. In particular, the sensitive transistors are those which operate with a relatively low current.

In order to overcome this problem detected within the scope of the present invention, the invention concerns a microstructure including an electronic circuit formed by a plurality of transistors integrated in a semiconductor substrate and a flat coil formed by a conductive wire or a conductive path extending in a spiral, this coil being arranged on an upper or lower face of the semiconductor substrate, each of said transistors being formed by at least two regions defining respectively a source and a collector between which an electric current is generated as a function of the electric state of the transistor, this microstructure being characterised in that at least a few transistors of said plurality of transistors and the surface defined by said flat coil are superposed with each other, at least the set of transistors, having high sensitivity when operating with a relatively low current among these few transistors being arranged so that said source and said collector of each of them are aligned along a direction perpendicular to the portion of said conductive wire or said conductive path situated in proximity to the transistor.

As a result of these features, the magnetic field generated by the flat coil is parallel to the alignment of the source and the collector of each of the transistors of the set of transistors having high sensitivity. Thus, the electrons forming the electric currents flowing in these transistors between the sources and collectors thereof are not subjected to Lorentz force and, in the case of field effect transistors (FET), the depth of the channel between the source and the collector is not affected by the presence of the coil superposed with the electronic circuit integrated in the substrate acting as a support structure for said coil.

BRIEF DESCRIPTION OF THE DRAWING

The present invention will be described in more detail hereinafter with reference to the Figures which are given by way of non limiting example and in which.

DETAILED DESCRIPTION OF PREFERRED EMBODIMENTS

Figure 1:
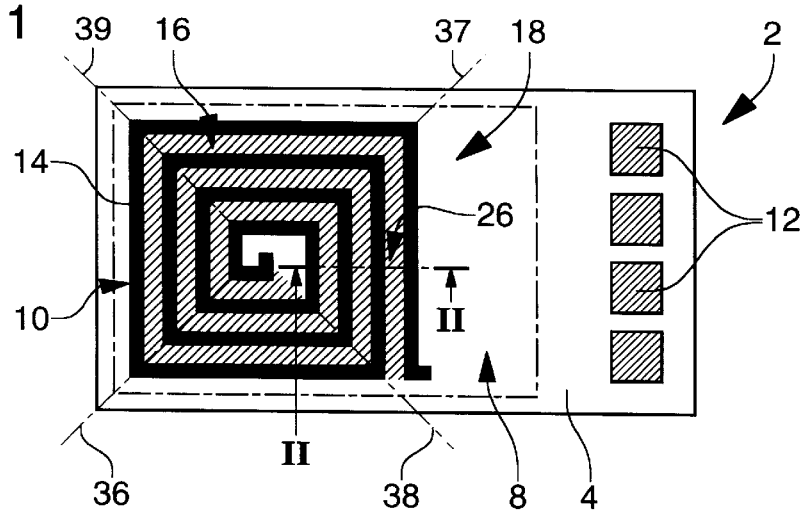
FIG. 1 is a plane view of an inductive sensor according to the invention.
Figure 2:
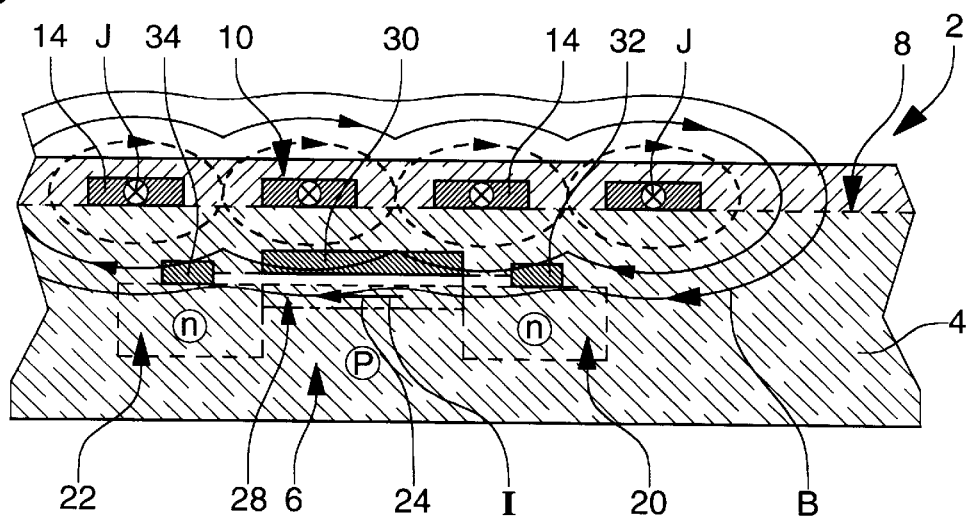
FIG. 2 is a cross-section along the line II—II of FIG. 1.

With reference to FIGS. 1 and 2, a general embodiment of a microstructure according to the invention will be described hereinafter. Inductive sensor 2 includes a semiconductor substrate 4 in which is integrated an electronic circuit formed by a plurality of transistors 6. On the upper face of substrate 4 is arranged a flat coil 10 and contact pads 12. In FIG. 2 coil 14 is arranged on upper surface 8 and is covered by a passivation or protective layer which has not been shown in FIG. 1.

Coil 10 is formed by a conductive wire or conductive path 14 which develops in a spiral. In the variant shown here, coil 10 thus extends in a spiral over a single same plane. However, it is possible to provide a flat coil arranged over several levels separated by passivation layers. The coil can be obtained by various methods known to those skilled in the art, in particular by vacuum deposition of a metal layer, as in the case of FIG. 2, or by a galvanic method, as for the variant shown in FIG. 3.

Figure 3:
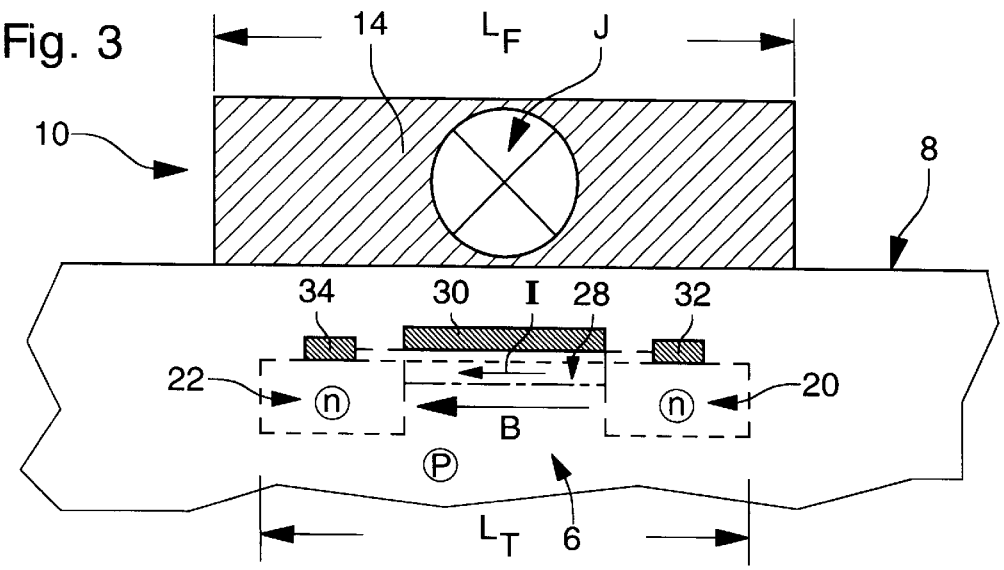
FIG. 3 is a similar cross-section to FIG. 2 of a preferred variant of the invention.

Coil 10 defines a surface 16 (hatched surface in FIG. 1). The electronic circuit forming sensor 2 is integrated in substrate 4 within the region 18 defined by a dotted line. Surface 16 is situated within region 18, in superposition according to a top plane view (FIG. 1). At least a few transistors, of the plurality of transistors forming the electronic circuit of sensor 2, and the surface 16, defined by coil 10, are superposed with each other. According to the invention, at least the set of one transistors (transistor 6 is shown in FIGS. 2 and 3) which have high sensitivity when operating with a relatively low current, among the transistors superposed with surface 16, are arranged so that source 20 and collector 22 of each of them are aligned along a direction 24 corresponding to the direction of the electric current I generated in transistor 6 between source 20 and collector 22 as a function of the electric state of transistor 6. This direction is perpendicular to portion 26 of conductive wire or conductive path 14, that is situated in immediate proximity to transistor 6 (as shown is FIGS. 1 and 2).

Transistor 6 is a field effect transistor (FET) in which a channel 28 of variable depth is generated between source 20 and collector 22 as a function of the electric state applied to the control electrode 30 defining the gate of transistor 6. It will be noted that source 20 and collector 22 are respectively associated with two electrodes 32 and 34. According to the invention, the current I flowing in channel 28 is substantially parallel to the magnetic field B generated by coil 10 in the vicinity of channel 28. Thus, there is almost no Lorentz force on the electrons which circulate between the source and the collector of the transistor.

It will be noted in FIG. 1 that the coil is wound in a spiral along rectilinear segments defining a square or rectangular profile of the coil winding. Between the four semi-diagonals 36, 37, 38 and 39, four regions of surface 16 can be defined in which the wire or metallised path 14 defines a set of linear segments which are parallel to each other. Thus, in each of these four regions, the direction perpendicular to that of wire or path 14 is univoque. Preferably, the sensitive transistors of the integrated circuit are each superposed in only one of these four regions, at a certain distance from the semi-diagonals. The direction of magnetic field B passing through the transistor is thus well defined and substantially perpendicular to the direction of the linear segments of wire or path 14. One thus guarantees that magnetic field B is substantially parallel to electric current I in the transistor 6 whose channel 28 is perpendicular to portion 26 of coil 10.

FIG. 3 shows a variant of the invention forming an improvement of the first embodiment described hereinbefore. Electric wire 14 of coil 10 is obtained in particular by a galvanic bath. This wire 14 has a width $L_F$ of several micrometers ($\mu$m). The length $L_T$ of transistor 6 is less than width $L_F$ of wire 14. According to the invention, each transistor 6 of the set of transistors superposed with surface 26 defined by coil 10 and having high sensitivity is arranged so that each of them is situated under wire 14. Given that the magnetic field generated by a single segment of coil 10 is circular around this segment, the resulting magnetic field in immediate proximity to the segment is substantially parallel to the direction defined by channel 28 between source 20 and collector 22 of transistor 6 situated under wire 14.

In FIGS. 2 and 3, the electric current J circulating in wire 14 is symbolised by a cross in a circle.

Figure 4:
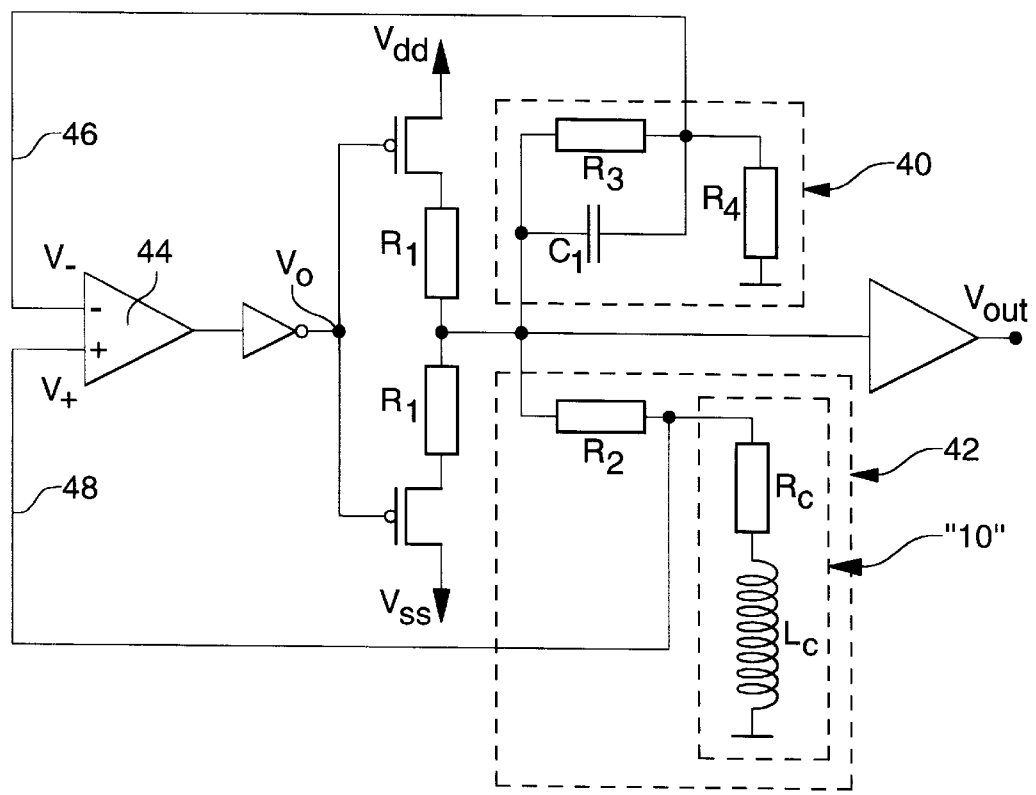
FIGS. 4 and 5 are two diagrams showing the electronic circuit of an inductive sensor formed by a differential relaxation oscillator.
Figure 5:
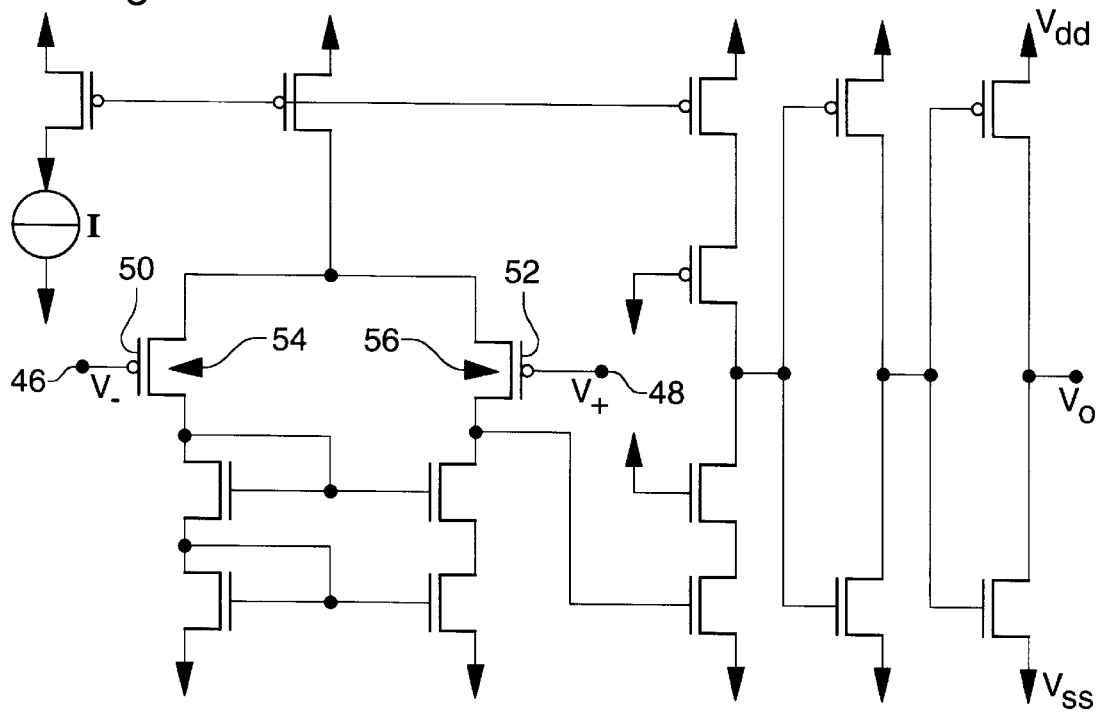

FIGS. 4 and 5 show an electronic diagram corresponding to an embodiment of the integrated circuit of sensor 2. FIG. 4 shows the general electronic diagram of a differential relaxation oscillator including a reference circuit 40, a detection circuit 42 including coil 10 electrically defined by an inductance $L_C$. and a resistor $R_C$. A comparator 44 has at its inputs a first connection 46 to reference circuit 40 and a second connection 48 to detection circuit 42.

FIG. 5 shows in more detail the electronic circuit forming comparator 44, which has cascaded current mirrors and cascaded amplification stages. Connections 46 and 48 are respectively connected to two control electrodes 50 and 52 of two input transistors 54 and 56. These two input transistors 54 and 56 are particularly sensitive when operating with relatively low electric currents. According to the invention, at least these two transistors 54 and 56 are arranged so that the direction of the electric current flowing in the channel between the source and the collector of these transistors is perpendicular to the direction of the wire of the coil situated in proximity to these transistors. Preferably, these two transistors 54 and 56 are arranged according to the preferred variant of FIG. 3.

During the design of the diagram of the integrated circuit, those skilled in the art can also arrange other transistors shown in FIG. 5 in a similar way to input transistors 54 and 56, i.e. according to an orientation defined by the present invention.

What is claimed is:

1. A microstructure comprising an electronic circuit formed by a plurality of transistors integrated in a semiconductor substrate, defining a main plane, and by a flat coil formed by a conductive wire or a conductive path extending in a spiral, said coil being arranged on an upper or lower face of said semiconductor substrate, each of said plurality of transistors comprising two regions defining respectively a source and a collector between which a current is generated as a function of an electric state of said each transistor, wherein a set of transistors, among said plurality of transistors, have high sensitivity by operating with a relatively low current, wherein at least one transistor, of said set of transistors, and a surface, defined by said flat coil, are superposed one above the other in projection in said main plane, and wherein said source and said collector of said at least one transistor are aligned along a direction perpendicular to, and in immediate proximity to, a portion of said conductive wire or said conductive path.

2. The microstructure according to claim 1, wherein said set of transistors includes field effect transistors, the channel between the source and the collector of each of said transistors defining said direction perpendicular to said portion of said conductive wire or said conductive path of said coil.

3. The microstructure according to claim 2, being an inductive sensor and including a differential relaxation oscillator comprising a comparator having at inputs thereof a first connection to a reference circuit and a second connection to said coil, said first and second connections being respectively connected to two control electrodes of two input transistors of said set of transistors.

4. The microstructure according to claim 3, wherein said set of transistors further includes transistors forming a current mirror or amplification stage.

5. The microstructure according to claim 1, wherein each transistor of said set of transistors is arranged under said conductive wire or said conductive path of said coil.

* * * * *